(12) United States Patent
Chen et al.

(10) Patent No.: US 6,182,357 B1
(45) Date of Patent: Feb. 6, 2001

(54) METHOD AND APPARATUS FOR DICING ELECTRONIC SUBSTRATE

(75) Inventors: Philip H. Chen, Tigard, OR (US); John C. Munson, McKinney; Timothy M. Gadd, League City, both of TX (US)

(73) Assignee: Intermedics Inc., Angleton, TX (US)

( * ) Notice: Under 35 U.S.C. 154(b), the term of this patent shall be extended for 0 days.

(21) Appl. No.: 09/225,275

(22) Filed: Jan. 5, 1999

(51) Int. Cl.$^7$ ...................................................... H05K 3/30
(52) U.S. Cl. ................... 29/832; 29/593; 29/740; 29/840; 29/411; 29/412
(58) Field of Search ............................ 29/832, 834, 836, 29/840, 740, 593, 411, 412

(56) References Cited

U.S. PATENT DOCUMENTS

| | | | |
|---|---|---|---|
| 4,426,773 | * 1/1984 | Hargis | 29/832 |
| 4,705,205 | 11/1987 | Allen et al. | 228/180 |
| 4,812,742 | * 3/1989 | Abel et al. | 324/73 |
| 5,031,073 | * 7/1991 | Chang | 361/410 |
| 5,034,568 | 7/1991 | Mather | 174/52.4 |
| 5,131,140 | * 7/1992 | Zimmer | 29/846 |
| 5,519,332 | 5/1996 | Wood et al. | 324/755 |
| 5,687,476 | * 11/1997 | Van Liere | 29/843 |
| 5,751,554 | 5/1998 | Williams et al. | 361/760 |

* cited by examiner

*Primary Examiner*—Carl J. Arbes
(74) *Attorney, Agent, or Firm*—Schwegman, Lundberg, Woessner & Kluth, P.A.

(57) ABSTRACT

A manufacturing method and apparatus for dicing printed circuit boards is disclosed that permits PCB's to be manufactured with greater component density and cut less expensively. The disclosed method includes forming a raw substrate to include conductive traces, mounting components on the substrate, testing the PCB and then cutting off the waste edges. The PCB can be formed and tested with components mounted on one or both sides of the PCB, and the waste edges can be cut off even with components mounted on both sides of the board. A workpiece fixture is provided that includes a recessed cavity into which PCB components extend. Double-sided boards can be cut using the disclosed workpiece fixture. The cavity includes a vacuum hole through which suction is provided to hold the PCB in place during cutting. Additional vacuum holes preferably are provided to hold the wings in place after they are removed. If desired, one or more saw blade guides can be formed in the workpiece fixture to accommodate a saw blade to avoid damaging the top surface of the fixture. The guides also permit PCB's to be cut without the need for space tape and the cost and imprecision associated with such tape. If desired, the substrate can be formed to include test pads in the wings which are subsequently cut off during manufacturing, thereby providing more room for components in the central area. As a result, the manufacturing process is simplified, manufacturing cost is reduced, and component density is increased.

21 Claims, 6 Drawing Sheets

METHOD AND APPARATUS FOR DICING ELECTRONIC SUBSTRATE

BACKGROUND OF THE INVENTION

1. Field of the Invention

The present invention generally relates to printed circuit boards. More particularly, the present invention relates to a method and apparatus for manufacturing printed circuit boards. Still more particularly, the present invention relates to a new, cost effective manufacturing technique for cutting ("dicing") a circuit board substrate that also permits an increase in the density of components on the board.

2. Background of the Invention

Many types of electronic equipment include printed circuit boards. A printed circuit board ("PCB") generally includes a substantially rigid substrate constructed from ceramic or other suitable material, semiconductors and other types of interconnected electronic components attached to the substrate. PCB's are widely used in a wide variety of electronic equipment such as computers, calculators, telephones, watches, pacemakers and cellular telephones.

Usually it is desirable, and in many instances imperative, that devices, such as laptop computers, implantable medical devices and cellular telephones, be as small as possible. Accordingly, the components used to construct such devices, including the PCB, must be miniaturized as much as possible. It is also desirable to reduce manufacturing cost whenever and wherever possible. Thus, designers and manufacturers of PCB's continuously strive to provide smaller, less expensive circuit boards that lower the cost of the finished product. The present invention generally relates to a method and apparatus for making PCB's smaller and less costly than previously possible. To fully appreciate the benefits of the invention, a conventional technique for manufacturing a typical PCB will now be described.

Referring first to FIG. 1, the layout of a conventional PCB 20 includes a substrate 22 and one or more electronic components 32 mounted on one or two sides of the substrate 22. The components 32 are mounted in a central circuit area 28 of the substrate 22. Usually, in the initial stages of manufacturing, the PCB 20 includes waste edges 24 (also referred to as "wings") on either side of the central circuit area 28. The waste edges 24 result from the fact that the raw substrate 22 typically is manufactured in a predefined width W, but the central circuit area 28 does not require the full width of the substrate 22. Also, one or more conductive test pads 26, electrically connected to various components 32, are included in central circuit area 28 for testing purposes as explained below.

A typical PCB manufacturing process will now be explained. As shown in FIG. 2, the substrate 22 is manufactured in step 40 and prepared for use to assemble the PCB. Step 40 includes creating all of the conductive traces on and within the substrate 22 for interconnecting the components that will be mounted on the substrate in step 50. In step 46 the waste edges 24 are removed using a conventional PCB chuck saw. The saw includes an electrically-controlled chuck table 34 as shown in FIG. 3 which has a substantially flat workpiece fixture 36 on which the PCB is placed. A precision circular saw (not shown) then is used to cut the substrate along lines 30 (FIG. 1) separating waste edges 24 from central circuit area 28. The table fixture 34 uses vacuum suction to hold the PCB 20 in place while the cutting step is performed. The vacuum is supplied from a vacuum pump (not shown) through slots or holes 38 in the workpiece fixture 36. As can be seen in FIG. 3, the workpiece fixture 36 of the chuck table 34 is flat to permit adequate suction for holding the PCB 20 in place. To use this type of chuck table, the PCB 20 must also be flat during cutting step 46, and thus the electrical components to be mounted on the substrate 22 typically are not mounted until after the waste edges are cut off.

Although it is desirable to cut through the substrate 22 in step 46, for obvious reasons it is not desirable to cut the top surface of the workpiece fixture 36 holding the PCB 20 and place. To avoid cutting the workpiece fixture 36, an adhesive polymer tape is applied to the bottom surface of the PCB 20 in step 42. The polymer tape acts as a spacer and typically is 0.003–0.005 inches thick. Further, the substrate 22 and polymer tape are baked in step 44 to activate the adhesive in the tape.

It is important to maintain the PCB 20 as clean as possible and to protect it from damage during manufacturing. To avoid damaging the PCB once the waste edges 24 are removed, the PCB is placed in a protective carrier (carrier not shown) in step 48. The carrier may be constructed from plastic or other suitable type of material and is generally a rigid structure whose purpose is to protect PCB during the remainder of the manufacturing process. In step 50, the components are mounted on the substrate 22 using conventional surface mount technology (SMT) or other suitable manufacturing technology. In step 52 the completed PCB is tested to insure that it functions as intended. The testing process typically includes one or more electrical tests in which the circuit on the PCB 20 is activated and the signals on the test pads 26 are monitored for proper signal level and timing. If the PCB passes testing, it is then assembled into the electrical equipment or sold as a separate component.

Because of the relatively high complexity of the conventional manufacturing method of FIG. 1, the potential for errors to occur is significant. Each step of a manufacturing process has risks for errors to occur. A process with many steps, therefore, has a greater chance for errors to occur than a process with fewer steps. Accordingly, it would be desirable to have a PCB manufacturing process with fewer steps than the conventional process of FIG. 2.

Additionally, the cost involved with the conventional manufacturing process shown in FIG. 2 is substantial. The cost includes:

The carriers used to hold and protect the PCB after the waste edges 24 are removed.

Cleaning and recycling the carriers for use with subsequent PCB's.

The polymer tape applied to the bottom surface of the substrate 22.

The oven needed to activate the polymer tape's adhesive. These costs and others drive up the price of the finished PCB. It is desirable to minimize manufacturing costs as much as possible.

As noted above, it is also desirable to miniaturize many PCB's to the fullest extent possible. Miniaturization involves two related aspects: (1) implementing a circuit on a PCB so as to take up as little surface area as possible, and (2) manufacturing a PCB to include as many components as possible in a given space. In either case, the "density" of the circuit is increased. The goal of PCB miniaturization generally involves includes the component density.

It would be highly desirable to have a less costly PCB manufacturing process. It would also be desirable to have a PCB manufacturing process for making PCB's with higher component density. Such PCB's would result in lower priced, smaller equipment that incorporate such PCB's.

BRIEF SUMMARY OF THE INVENTION

The problems noted above are solved in large part by a manufacturing method and apparatus for dicing printed circuit boards that permits PCB's to be cut without the need for a carrier. By avoiding the necessity for a carrier, the cost of the carrier is avoided as well as the cost of cleaning and otherwise recycling the carrier for subsequent use. Also, the method includes relatively fewer steps and thus has less potential for errors to occur. Further, the disclosed method and apparatus permits PCB's to be cut without the need for tape to be applied to the bottom surface of the substrate to act as a spacer. Thus, the cost of the tape is also avoided as well as the oven that is typically necessary to heat tape's adhesive.

The preferred manufacturing method generally comprises forming a raw substrate to include conductive traces, mounting components on the substrate, testing the PCB and then cutting off the waste edges ("wings"). The PCB can be formed and tested with components mounted on one or both sides of the PCB and the waste edges can be removed even with components mounted on both sides of the board. Because the wings are retained until after testing is completed, the PCB can be handled via the wings, thereby avoiding the necessity for a carrier.

To facilitate cutting a PCB including components mounted on the bottom side of the board, a workpiece fixture is provided that includes a recessed cavity into which PCB components protrude. Accordingly, double-sided boards (i.e., components mounted on both sides of the board) can be cut using the preferred workpiece fixture. The cavity includes a vacuum hole through which suction is provided to hold the PCB in place during cutting. Additional vacuum holes preferably are provided to hold the wings in place after being cut off. If desired, one or more saw blade guides can be formed in the workpiece fixture to accommodate a saw blade to avoid damaging the top surface of the fixture. The guides also permit PCB's to be cut without the need for space tape and the cost associated with such tape.

If desired, the substrate can be formed to include test pads in the wings which are subsequently removed during manufacturing. Locating the test pads on the wings, rather than on the central area of the board in which the components are mounted, provides more room for components in the central area. Component density advantageously is increased. These and other advantages will become apparent once the following disclosure and accompanying drawings are read.

BRIEF DESCRIPTION OF THE DRAWINGS

For a detailed description of the preferred embodiments of the invention, reference will now be made to the accompanying drawings in which.

DETAILED DESCRIPTION OF THE PREFERRED EMBODIMENTS

Figure 4:
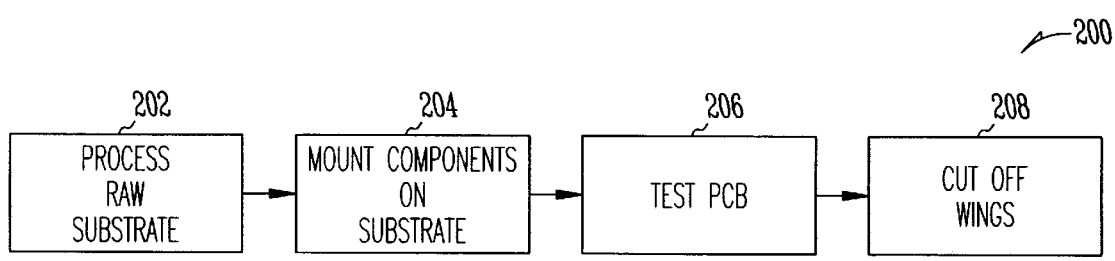
FIG. 4 is a block diagram showing the steps for manufacturing and testing a PCB in accordance with a preferred embodiment of the invention.

The preferred embodiment of the invention described below includes a method and apparatus for manufacturing printed circuit boards (PCB's) in a relatively simple manner to reduce the potential for errors to occur during manufacturing. The preferred embodiment also permits PCB's to be manufactured with greater component density than previously possible. Further, the preferred embodiment results in substantially lower cost than with conventional manufacturing techniques. The manufacturing apparatus includes a workpiece fixture that can receive PCB's with parts mounted on none, one or both sides of the substrate. The preferred manufacturing method is shown in FIG. 4 and will now be described. It should be noted, however, that although a particular set of manufacturing steps is shown in FIG. 4, numerous variations are possible without departing from the spirit of the invention.

Referring now to FIG. 4, the preferred method 200 for constructing a PCB generally includes four steps 202, 204, 206, and 208. In step 202, the raw substrate is manufactured and a "blank" PCB is formed. A "blank" PCB refers to a PCB without components mounted on the board. The PCB in step 202 is provided with one or more layers bonded together according to known manufacturing techniques. Each layer may include one or more conductive traces to interconnect the components that will be mounted on the board in step 204. Some of the layers in the substrate may be ground or power layers as would be understood by one of ordinary skill in the art. The PCB substrate processed during manufacturing step 202 preferably includes peripheral waste areas (referred to hereinafter as "wings").

Figure 5:
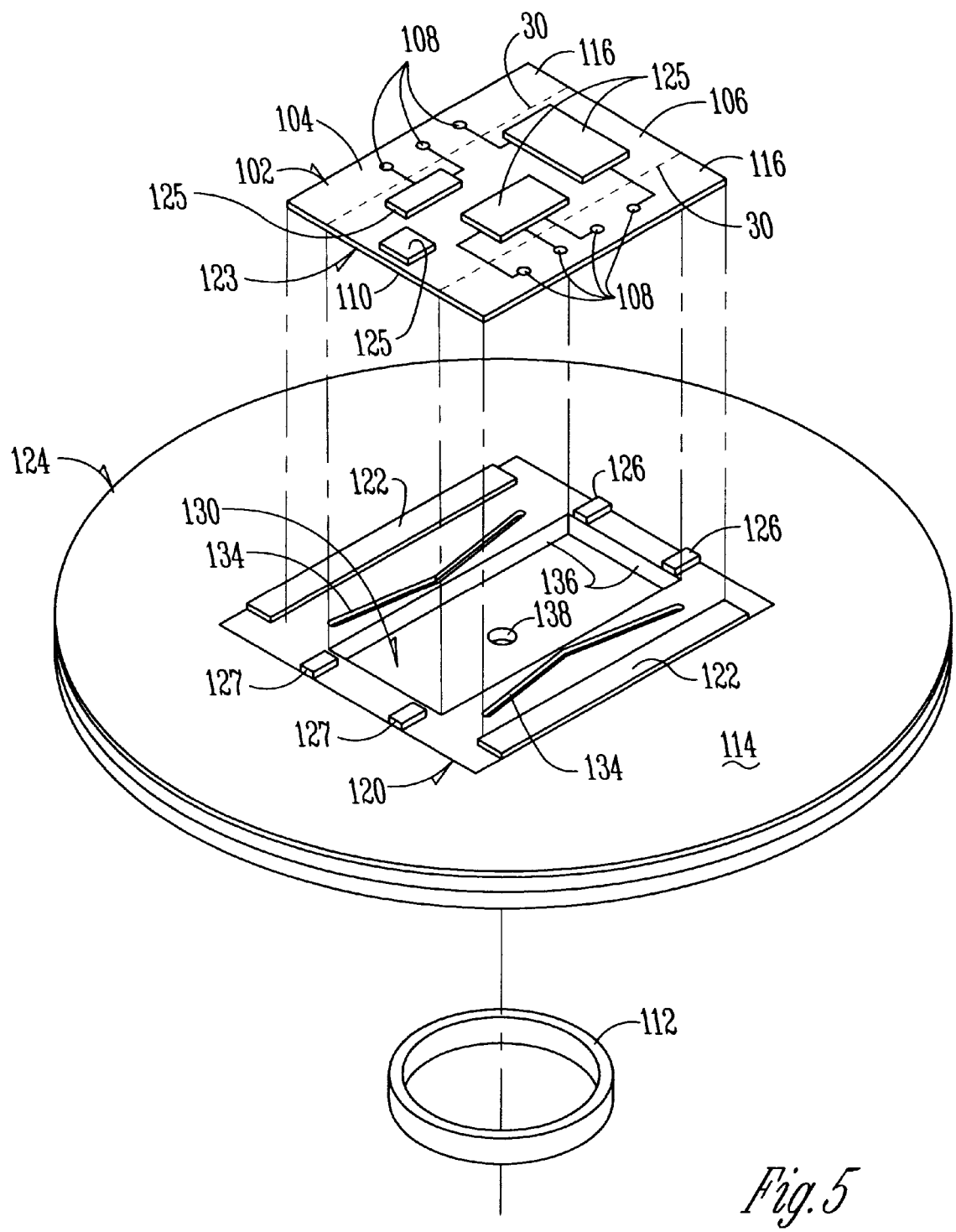
FIG. 5 is an isometric view of a PCB saw workpiece fixture in accordance with a preferred embodiment of the invention.
Figure 9:
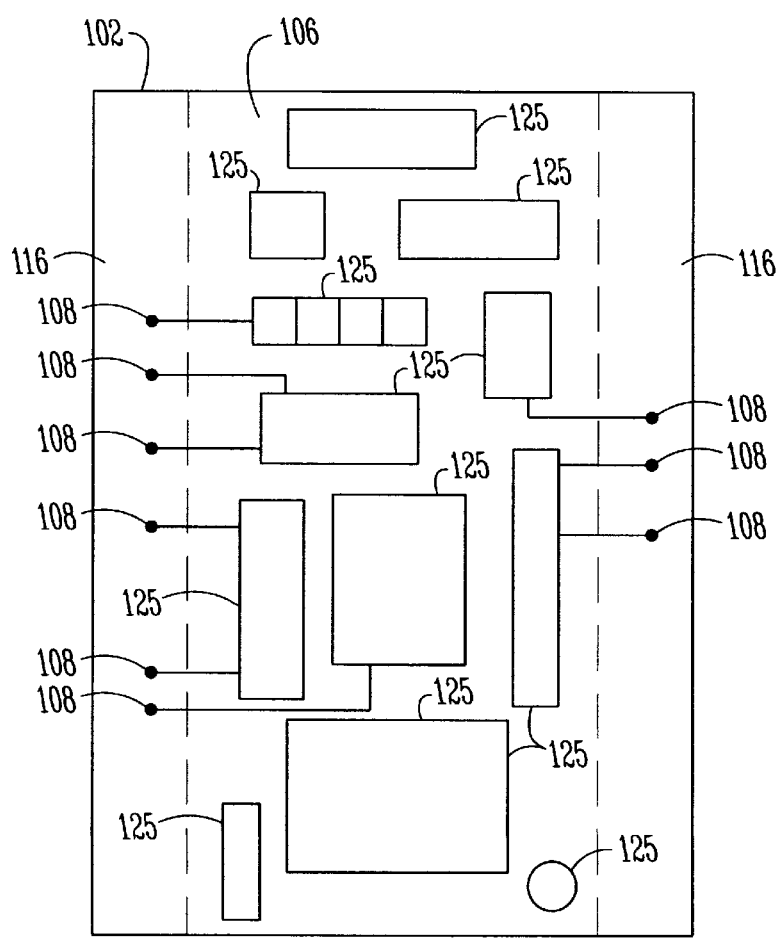
FIG. 9 is a top view of a PCB substrate in accordance with a preferred embodiment including test pads located outside the central area containing the electronic components.

Referring still to FIG. 4, the electrical components are mounted on the substrate in manufacturing step 204. Components can be mounted on one or both sides of the substrate as desired. Any suitable technique for attaching the components to the substrate, such as surface mount technology (SMT), can be used. At this point during the manufacturing method 200, the components are mounted on the PCB, yet the wings still are attached (i.e., the wings have not yet been cut off). Exemplary PCB's are shown in FIGS. 5 and 9. In step 206, the PCB preferably is tested using any suitable testing protocol and if the PCB passes the test, the wings are removed in step 208.

The preferred manufacturing method 200 shown in FIG. 4 advantageously permits a PCB to be manufactured and tested without the need for a carrier. The wings are not cut off until later in the manufacturing process in contrast to conventional manufacturing processes. More particularly, the wings preferably are not removed until after the PCB is tested in step 206. Leaving the wings in place permits the PCB to be handled by hand without touching the circuit components on the board; the PCB can be handled by touching only the wings. The potential for contaminating the wings is acceptable because the wings will ultimately be removed anyway. Because the PCB can be handled by holding the wings, a protective carrier is not needed, and thus the cost of the carrier is avoided along with the cost of cleaning the carrier for subsequent use.

Because the wings are cut off after components are mounted on the PCB, the use of a conventional workpiece fixture may be difficult, particularly if components are mounted on the surface of the PCB that must be placed in contact with the flat surface of the conventional fixture. To solve this problem, a workpiece fixture that can accommodate non-flat workpieces, such as PCB's with parts mounted thereon, preferably is used. FIG. 5 shows one embodiment of such a workpiece fixture.

The preferred workpiece fixture 124 shown in FIG. 5 is shown and described with respect to the PCB 102 shown. The exemplary PCB 102 shown in FIG. 5 includes a substrate 123 having a central circuit area 106 and a pair of wings 116. The substrate includes a top surface 104 and a bottom surface 110 and various circuit components 125 mounted on the top surface 104 in the central circuit area 106. If desired, components can also be mounted on the bottom surface 110. A PCB assembled with components mounted on both sides of the substrate is referred to as a "double-sided" board.

Figure 8:
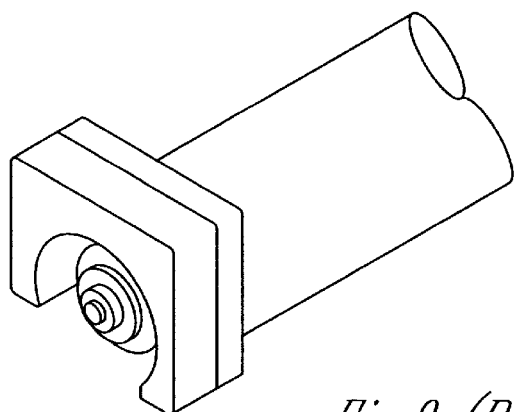
FIG. 8 is an isometric view of a saw used in conjunction with the workpiece fixture of FIG. 5.

Referring still to FIG. 5, the workpiece fixture 124 constructed in accordance with the preferred embodiment is shown to include a top surface 114 with a central portion 120 onto which a PCB 102 with components mounted thereon can be placed for cutting by a saw as shown in FIG. 8. If desired, central portion 120 may be raised with respect to top surface 114. Preferably, the central portion 120 is raised by approximately 0.005 inches. A raised central portion 120 provides a convenient way to calibrate, or "zero", the height of the saw blade. The saw blade can be lowered to touch the top surface 114 and the vertical height can be calibrated as being at the "zero" position at that point. Once "zeroed", the height of the blade then can be accurately adjusted by predetermined distances that are offsets from the zero point.

Figure 3:
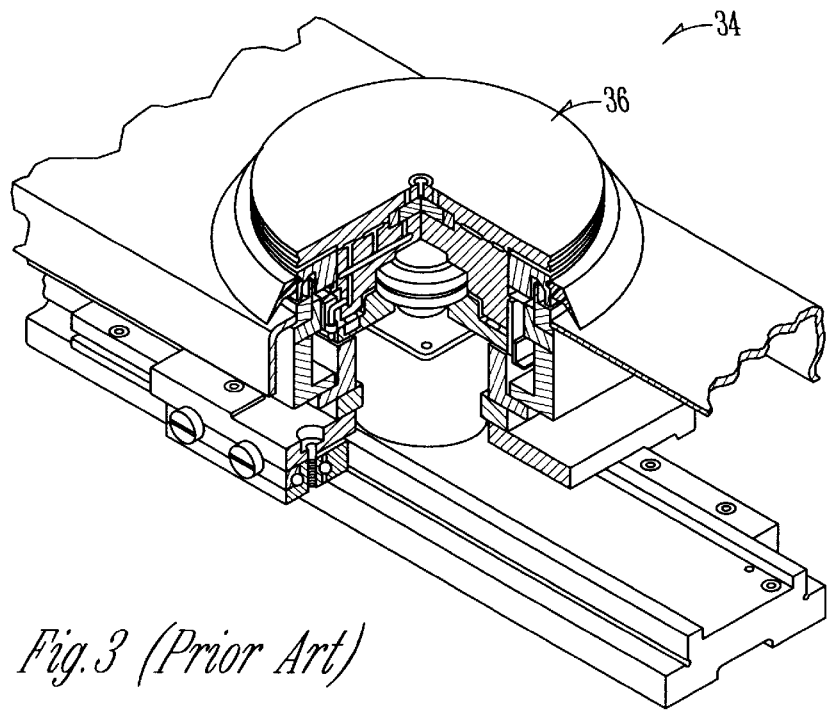
FIG. 3 is an isometric cut-away view of a conventional workpiece fixture for a PCB saw having a flat surface for receiving a PCB substrate.

The workpiece fixture 124 preferably is made from a metal or other durable material. An exemplary saw for cutting the PCB 102 is shown in FIG. 9. The preferred workpiece fixture 124 is mated with or otherwise coupled to a chuck table such as that shown in FIG. 3, with the flat workpiece fixture 36 of FIG. 3 replaced by the preferred fixture 124 of FIG. 5.

The PCB receiving portion 120 preferably includes a recessed cavity 130. The recessed cavity generally is defined by side surfaces 136. As shown, the recessed cavity 130 preferably has a rectangular shape to receive the substantially rectangular PCB 102. Alternatively, the recessed cavity 130 can have any desired shape, and generally is constructed according to the shape of the PCB substrate desired to be cut using the table. For example, the recessed cavity 130 may be round to accommodate a round PCB.

Using the workpiece fixture 124 shown in FIG. 5, a PCB without electrical components mounted thereon or a PCB with components mounted on one or both sides of the substrate 123 can be cut. The depth of the recessed cavity 130, which is defined by the side surfaces 136, preferably is sufficient to permit the PCB 102 to be placed on top of the workpiece fixture 124 with the board's underside components, if included, protruding into the recessed cavity 130. With a cavity 130 to receive the protruding components, the workpiece fixture 123 is able to accommodate non-flat PCB's for cutting.

Figure 6:
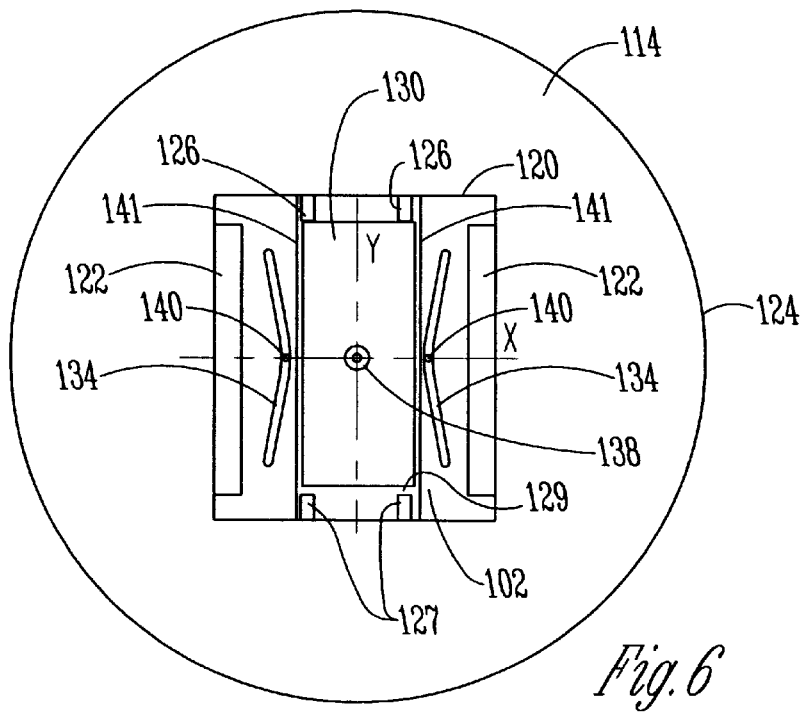
FIG. 6 is a top view of the base fixture of FIG. 5.

The PCB 102 preferably is maintained in place by vacuum suction created by a conventional vacuum source (not shown) such as Model H2/6T manufactured by Disco Hi-Tech. A plurality of bore holes are formed in the workpiece fixture 124 to which the vacuum source couples. A central vacuum hole 138 is shown for retaining the central circuit area 106 in place. The workpiece fixture 124 preferably also includes a pair of angled grooves 134 formed on either side of recessed cavity 130. As best shown in FIG. 6, each groove 134 includes at least one vacuum hole 140 to which the vacuum source couples. Through angled vacuum grooves 134, suction is provided to retain the wings 116 in place, particularly after being cut off to prevent the separated wings from moving and damaging the circuit area 106 and damaging the saw blade or from harming the saw operator. Additional vacuum holes can be included if desired to help retain the PCB 102 in place. An inner ring seal 112, shown in FIG. 5, may be included to insure adequate vacuum suction through holes 138, 140.

Figure 7:
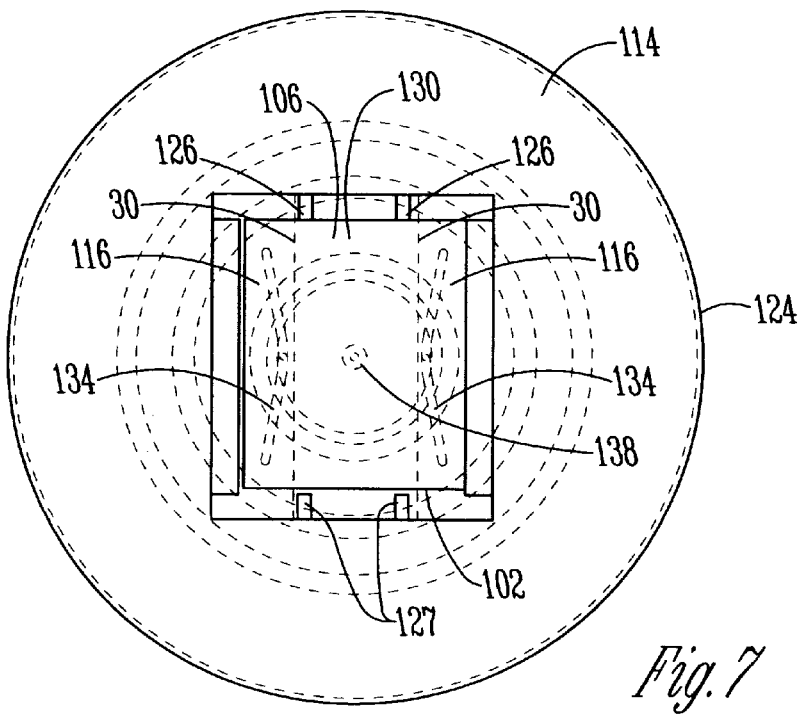
FIG. 7 is top view of the workpiece fixture as in FIG. 6 illustrating a substrate as in FIG. 9 positioned on top of the workpiece fixture.

The workpiece fixture 124 also is shown in FIGS. 6–7 in accordance with the preferred embodiment of the invention. FIGS. 6 and 7 show the top surface 114 of the workpiece fixture 124 with (FIG. 7) and without (FIG. 6) PCB 102 in place. Central portion 120 includes vertical retaining tabs 126 and 127 on either end of recessed cavity 130. Retaining tabs 126, 127 are provided to prevent the PCB 102 from moving along the Y-axis while being cut. If desired for increased stability, retaining tabs 127 can be separated from recessed cavity 130 by a distance D1 which may be, for example, approximately 2 to 3 inches. This spacing provides the workpiece fixture with a "lip" 129 on which one end of the PCB 102 will be disposed. The central portion 120 of workpiece fixture 124 also includes lateral retaining tabs 122 to prevent the workpiece from moving laterally along the X-axis while being cut.

When the PCB 102 is placed on top of the workpiece fixture 124, as best seen in FIG. 7, the circuit area 106 substantially covers the recessed cavity 130. Vacuum suction provided through vacuum hole 138 substantially evacuates the air enclosed by the PCB cavity 130, thereby providing the force to retain the PCB in place. The wings 116 of the PCB 102 generally cover the angled vacuum grooves 134 and are retained in place by suction from vacuum grooves 134 after the wings are cut from the circuit area 106.

Referring to FIG. 6, if desired, a pair of saw blade guides 141 can be formed in the top surface 114 of workpiece fixture 124. If included, the guides 141 are wide enough to accommodate the saw blade (not shown). The guides 141 permit the blade to be lowered sufficiently to insure that the blade cuts completely through the substrate without cutting the top surface 114 of the workpiece fixture 124. Preferably, the guides 141 are approximately 0.005 inches deep and 0.1 inches wide, although other dimensions are acceptable as well. The guides permit the PCB 102 to be cut without the need for polymer tape to act as a spacer as has typically been used in conventional PCB manufacturing methods.

Figure 1:
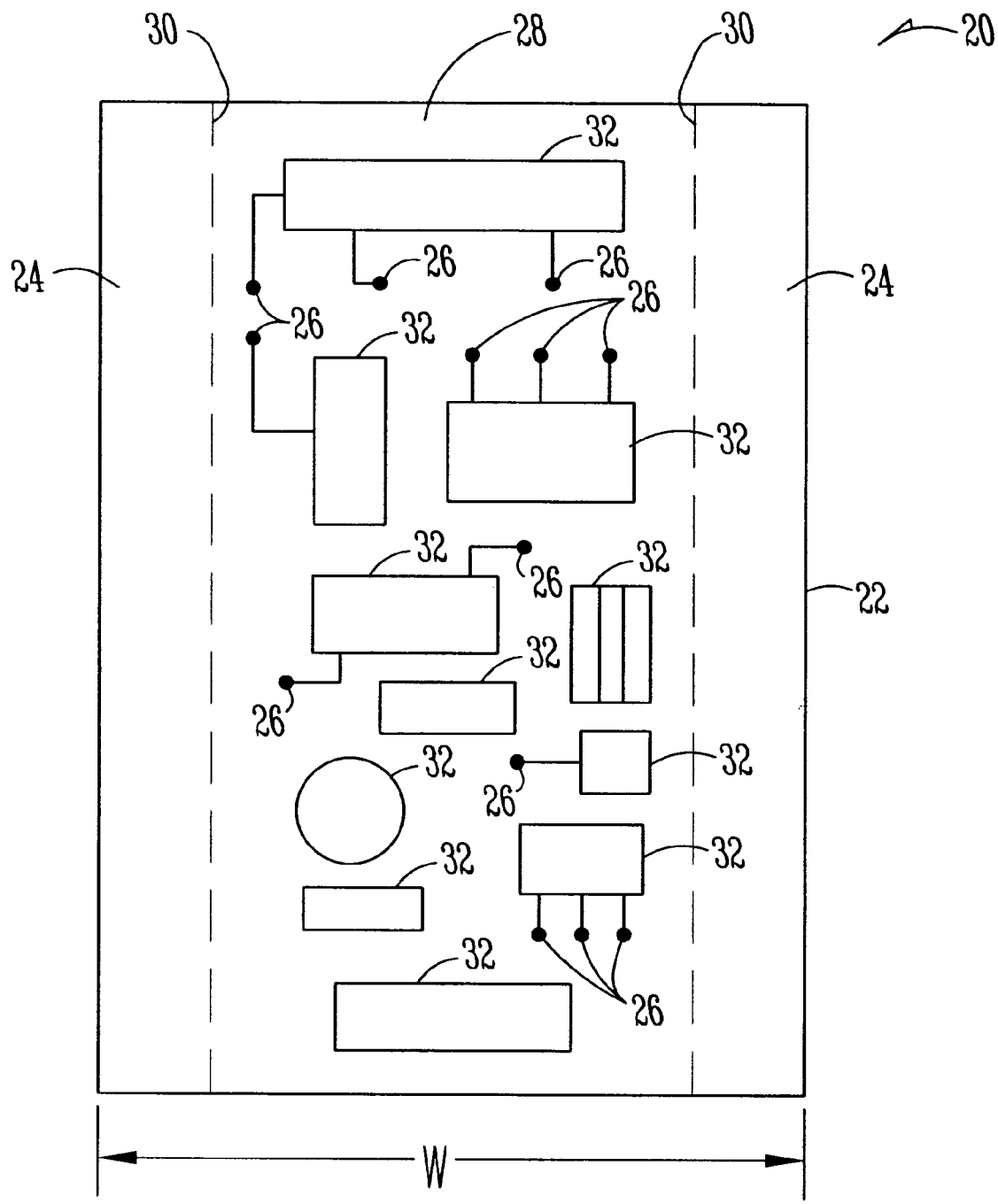
FIG. 1 is a top view of a conventional substrate with test pads located on the circuit board in the area containing the electronic components.
Figure 2:
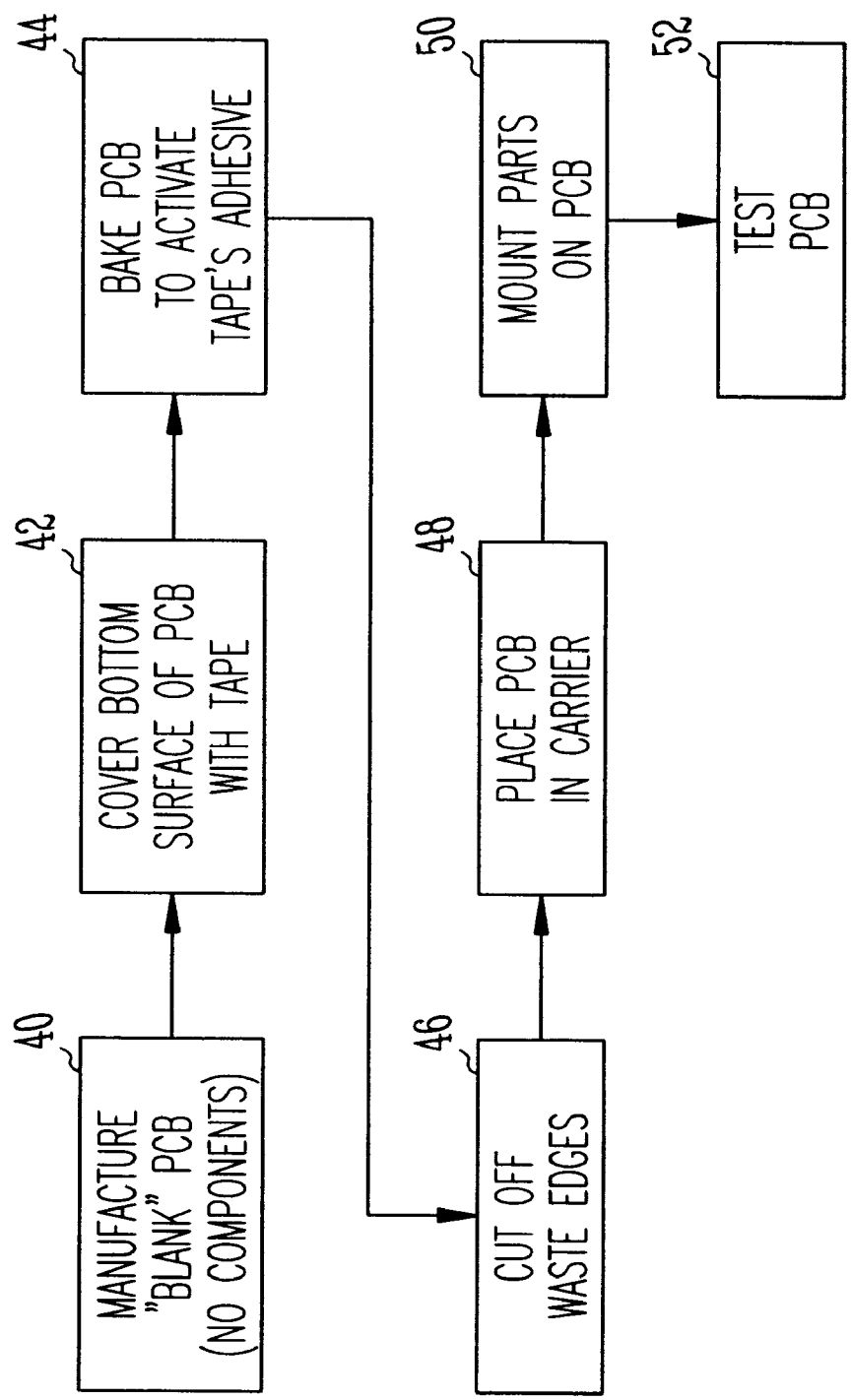
FIG. 2 is a block diagram showing the conventional process for manufacturing a printed circuit board.

As noted above, increasing component density on a PCB is highly desirable for miniaturization of electronics. Referring briefly to the conventional PCB 20 shown in FIG. 1, it is noted that the test pads 26 are included within the central circuit area 28 of the PCB 20. Each test pad 26 occupies a certain amount of surface area on the substrate. By contrast, in the present invention, the preferred embodiment of the manufacturing method 200 and the workpiece fixture 124 permits higher density PCB's to be manufactured by forming the test pads on the wings 116 of the PCB 102. Accordingly, manufacturing step 202 may include forming the substrate with test pads on the wings and connecting the test pads via conductive traces to the central circuit area 106.

As shown in FIGS. 5 and 9, test pads 108 preferably are formed using conventional etching techniques in the wings 116 of the PCB 102 rather than in the central circuit area 106. With the test pads 108 on the wings 116, the components 125 can be located in closer proximity to each other, thereby increasing component density. After the PCB 102 is tested in step 206 of the preferred manufacturing method 200 of FIG. 4, the wings and, accordingly, the test pads 108 are removed in step 208. As such, the test pads 108 advantageously are located on portions of the PCB that are subsequently eliminated and thus the central circuit area 106 need not have dedicated surface area for the test pads.

Many PCB's are manufactured as double-sided boards (i.e., components mounted on both sides of the substrate) for increased component density. A double-sided PCB with test pads on the wings as shown in FIG. 9 would be difficult, if not impossible, to cut using a conventional workpiece fixture such as that shown in FIG. 3. The prior art workpiece fixture surface 36 shown in FIG. 3 requires the PCB to have a flat surface in contact with the surface 36. As such, if a double-sided PCB was to be manufactured with test pads on the wings and components mounted on both sides, the wings could not thereafter be cut off using a conventional workpiece fixture 34. Accordingly, PCB's cut using the conventional workpiece fixture 34 shown in FIG. 3 may not have components mounted on both sides nor may they have test pads on the wings. PCB's can be cut using a conventional workpiece fixture if the PCB is blank or has components mounted on only one side of the substrate.

In the present invention, however, the recessed cavity 130 of workpiece fixture 124, permits double-sided PCB's to be cut. Thus, single or double-sided PCB's with test pads on the wings can be manufactured and tested using the preferred manufacturing method 200 shown in FIG. 4. The resulting PCB's are no longer required to have test pads positioned in the central circuit area 106 and, therefore, the PCB's can have a higher component density than previously possible. Usually, once a PCB passes testing, access to the test pads is no longer needed. If, however, continued access to the test pads is desired, PCB's with test pads in the central circuit area 106 can be manufactured using the method 200 and workpiece fixture 124 described above.

The above discussion is meant to be illustrative of the principles of the present invention. Numerous variations and modifications will become apparent to those skilled in the art once the above disclosure is fully appreciated. It is intended that the following claims be interpreted to embrace all such variations and modifications.

What is claimed is:

1. A method of manufacturing a printed circuit board (PCB), comprising:
    mounting electrical components on a substrate, the substrate having a peripheral area;
    testing the printed circuit board with the components mounted thereon;
    holding the printed circuit board in place using a vacuum; and
    removing the peripheral area of the substrate.

2. The method of claim 1 further including forming test pads on the peripheral areas.

3. A method of manufacturing a printed circuit board (PCB), comprising:
    forming a substrate to include a central circuit area and a peripheral area;
    forming test pads in the peripheral area;
    connecting the test pads via conductive traces to the central circuit area;
    mounting electrical components on the substrate in the central circuit area;
    testing the printed circuit board with the electrical components mounted thereon; and
    holding the printed circuit board in place using a vacuum while removing the peripheral area of the substrate.

4. The method of claim 1 wherein the method of removing the peripheral area of the substrate comprises sawing.

5. The method of claim 1 wherein the mounting electrical components on a substrate further comprises mounting electrical components on one or more sides of the printed circuit board.

6. The method of claim 1, wherein the holding the printed circuit board in place using a vacuum comprises:
    placing the printed circuit board in a sawing fixture, the sawing fixture comprising:
        a base;
        a recessed cavity formed in the base adapted to accept a printed circuit board; and
        a first vacuum hole formed in the recessed cavity; and
    creating a vacuum suction through the first vacuum hole formed in the recessed cavity.

7. The method of claim 6, the base further comprising one or more retaining tabs adjacent the recessed cavity, the one or more retaining tabs adapted to retain the printed circuit board from sliding.

8. The method of claim 6, wherein the holding the printed circuit board in place using a vacuum further comprises:
    forming one or more vacuum holes in the base adjacent the recessed cavity; and
    creating a vacuum suction through the one or more vacuum holes adapted to retain the peripheral area after being sawed.

9. The method of claim 2 wherein the testing of the printed circuit board with the components mounted thereon further comprises testing the electrical components via the test pads.

10. The method of claim 3 wherein the method of removing the peripheral area of the substrate comprises sawing.

11. The method of claim 3 wherein the mounting electrical components on a substrate further comprises mounting electrical components on one or more sides of the printed circuit board.

12. The method of claim 3, wherein the holding the printed circuit board in place using a vacuum comprises:
    placing the printed circuit board in a sawing fixture, the sawing fixture comprising:
        a base;
        a recessed cavity formed in the base adapted to accept a printed circuit board; and
        a first vacuum hole formed in the recessed cavity; and
    creating a vacuum suction through the first vacuum hole formed in the recessed cavity.

13. The method of claim 12, the base further comprising one or more retaining tabs adjacent the recessed cavity, the one or more retaining tabs adapted to retain the printed circuit board from sliding.

14. The method of claim 12, wherein the holding the printed circuit board in place using a vacuum further comprises:
    forming one or more vacuum holes in the base adjacent the recessed cavity; and
    creating a vacuum suction through the one or more vacuum holes adapted to retain the peripheral area after being sawed.

15. A method, comprising:
forming a substrate to include a central circuit area and a peripheral area;
forming one or more test pads in the peripheral area;
connecting the one or more test pads via one or more conductive traces to the central circuit area;
mounting one or more electrical components on the substrate in the central circuit area;
testing the printed circuit board with the one or more electrical components mounted thereon;
holding the printed circuit board in place using a vacuum; and
removing the peripheral area of the substrate.

16. The method of claim 15 wherein the method of removing the peripheral area of the substrate comprises sawing.

17. The method of claim 15, wherein the mounting one or more electrical components on a substrate further comprises mounting one or more electrical components on one or more sides of the printed circuit board.

18. The method of claim 15, wherein the holding the printed circuit board in place using a vacuum comprises:
placing the printed circuit board in a sawing fixture, the sawing fixture comprising:
a base;
a recessed cavity formed in the base adapted to accept a printed circuit board; and
one or more vacuum holes formed in the recessed cavity; and
supplying a vacuum suction through the one or more vacuum holes formed in the recessed cavity.

19. The method of claim 18, wherein the holding the printed circuit board in place using a vacuum further comprises:
placing the printed circuit board adjoining one or more retaining tabs, the one or more retaining tabs adjacent the recessed cavity, the one or more retaining tabs adapted to prevent the printed circuit board from sliding.

20. The method of claim 18, wherein the holding the printed circuit board in place using a vacuum further comprises:
forming one or more vacuum holes in the base adjacent the recessed cavity; and
supplying a vacuum suction through the one or more vacuum holes adapted to retain the peripheral area after being sawed.

21. The method of claim 15 wherein the testing of the printed circuit board with the one or more electrical components mounted thereon further comprises testing the one or more electrical components via the one or more test pads.

* * * * *